United States Patent
Inukai

(10) Patent No.: US 7,148,829 B2
(45) Date of Patent: Dec. 12, 2006

(54) DELTA-SIGMA MODULATION CIRCUIT WITH GAIN CONTROL FUNCTION

(75) Inventor: Fumihito Inukai, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/240,575

(22) Filed: Oct. 3, 2005

(65) Prior Publication Data

US 2006/0071835 A1    Apr. 6, 2006

(30) Foreign Application Priority Data

Oct. 1, 2004    (JP)    ............................. 2004-290318

(51) Int. Cl.
*H03M 1/62* (2006.01)
(52) U.S. Cl. ..................... 341/139; 341/143
(58) Field of Classification Search ................ 341/144, 341/143, 139, 200
See application file for complete search history.

(56) References Cited

U.S. PATENT DOCUMENTS 6,404,367 B1 *    6/2002    Van der Zwan et al. .... 341/143
6,567,025 B1 *    5/2003    Schreier et al. ............. 341/143
2004/0207549 A1 *    10/2004    Easwaran et al. ........... 341/139
2006/0092059 A1 *    5/2006    Gulmaraes ................. 341/143

FOREIGN PATENT DOCUMENTS

JP    818457    1/1996

* cited by examiner

*Primary Examiner*—Brian Young
(74) *Attorney, Agent, or Firm*—Stevens, Davis, Miller & Mosher, LLP

(57) ABSTRACT

A delta-sigma modulation circuit with a gain control function includes a variable gain amplifier, a control unit that controls the gain of the variable gain amplifier, a delta-sigma modulator that inputs an output from the variable gain amplifier, and a filter circuit that inputs an output from the delta-sigma modulator. The control unit that controls the gain of the variable gain amplifier gain controls the delta-sigma modulator. By this, the optimum dynamic range is obtained according to the setting level of the variable gain amplifier without causing the dynamic range to vary depending on the setting level of the variable gain amplifier.

13 Claims, 17 Drawing Sheets

Fig. 3

| CONTROL SIGNAL CS1 | 00 | 01 | 10 |
|---|---|---|---|
| GAIN OF VARIABLE GAIN AMPLIFIER | Ga | Gb | Gc |
| CONTROL SIGNAL CS2 | 00 | 01 | 10 |
| GAIN OF DELTA-SIGMA MODULATOR | $1/Aa$ | $Ga/(Aa \cdot Gb)$ | $Ga/(Aa \cdot Gc)$ |
| CONTROL SIGNAL CS3 | 00 | 01 | 10 |
| GAIN OF FILTER CIRCUIT | A1 | $Aa \cdot Gb/Ga$ | $Aa \cdot Gc/Ga$ |

Fig. 6

| CONTROL SIGNAL CS1 | 00 | 01 | 10 |
|---|---|---|---|
| AGC OUTPUT HOLDING LEVEL | V1 | V2 | V3 |
| CONTROL SIGNAL CS2 | 00 | 01 | 10 |
| GAIN OF DELTA-SIGMA MODULATOR | 1/A1 | V1/(A2·V2) | V1/(A3·V3) |
| CONTROL SIGNAL CS3 | 00 | 01 | 10 |
| GAIN OF FILTER CIRCUIT | A1 | A1·V2/V1 | A1·V3/V1 |

Fig. 10

| CONTROL SIGNAL CS1 | 00 | 01 | 10 |
|---|---|---|---|
| AGC OUTPUT HOLDING LEVEL | V1 | V2 | V3 |
| CONTROL SIGNAL CS2 | 00 | 01 | 10 |
| GAIN OF DELTA-SIGMA MODULATOR | 1/A1 | V1/(A2·V2) | V1/(A3·V3) |
| CONTROL SIGNAL CS4 | 00 | 01 | 10 |
| GAIN OF NOISE REMOVING CIRCUIT | A1 | A1·V2/V1 | A1·V3/V1 |

DELTA-SIGMA MODULATION CIRCUIT WITH GAIN CONTROL FUNCTION

BACKGROUND OF THE INVENTION

1. Field of the Invention

The present invention relates to a delta-sigma modulation circuit, and in particular, to a delta-sigma modulation circuit with a gain control function, with which the optimum S/N can be obtained according to the setting level of a variable gain amplifier.

2. Description of the Background Art

Conventionally, a system using a delta-sigma modulator has been known. The system is used in, for example, an A/D conversion circuit and a D/A conversion circuit for digital audio equipment. As a system such as the one described above, a system exists in which after the signal level is adjusted by a variable gain amplifier the signal is inputted to a delta-sigma modulator. Further, a system is used in which by implementing an automatic gain control (AGC) circuit the signal level is adjusted to an appropriate level and thereafter the signal is delta-sigma modulated.

FIG. 12 is a diagram showing, as a first conventional example, a configuration of a delta-sigma modulation circuit with a variable gain amplifier, which employs a single-stage first-order delta-sigma modulator.

An external signal is first inputted to a variable gain amplifier 1. The gain of the variable gain amplifier 1 is controlled by a control signal CS1 outputted from a digital signal processor (DSP) 2.

A first-order delta-sigma modulator 3 is composed of an adder-subtractor 8 that subtracts a feedback reference level ($+V_{REF}$ or $-V_{REF}$) from an output signal X from the variable gain amplifier 1; an integrator 9 that inputs an output signal from the adder-subtractor 8; a quantizer 6 that quantizes an output from the integrator 9 to predetermined bits; and a level fixed feedback circuit 31 that generates the feedback reference level based on a digital output signal Y from the quantizer 6. The integrator 9 and the adder-subtractor 8 compose an integration circuit 5.

An output signal Y from the delta-sigma modulator 3 is inputted to a filter circuit 4 where a necessary signal band is extracted. Note that in FIG. 12 the symbol Q denotes a quantization error generated between before and after the quantizer 6.

In such a delta-sigma modulation circuit, to reduce the noise component contained in the output signal Y from the delta-sigma modulator 3, a method of reducing the gain of the delta-sigma modulator 3 to 1/A (A is an arbitrary numeric value greater than 1) is used. This approach is based on the consideration that the delta-sigma modulator 3 in FIG. 12 has such noise characteristics as those shown in FIG. 13, with respect to the amplitude level of the input signal X. The curve in FIG. 13 represents the characteristics, in the delta-sigma modulator 3, of the quantization noise level contained in the amplitude level of the output signal Y, with respect to the amplitude level of the input signal X.

In the delta-sigma modulator 3, as shown in FIG. 13, when the amplitude level of the input signal X to the delta-sigma modulator 3 approximates the feedback reference level $V_{REF}$, the situation called "overload" occurs where the quantization noise level contained in the amplitude level of the output signal Y increases. In view of this, the value of the feedback reference level is set such that the maximum amplitude level of the positive and negative portions of the input signal X with respect to the positive and negative portions of the feedback reference level ($\pm V_{REF}$) is 1/A. For example, if the overload level is 0.8 $V_{REF}$ and the maximum value of the amplitude level of the input signal X is given as $X_{MAX}$, the feedback reference level $V_{REF}$ is set as follows:

$$V_{REF} = X_{MAX} \div 0.8 = 1.25 \cdot X_{MAX} \tag{1}$$

In this case, the gain (1/A) of the delta-sigma modulator 3 has the following value:

$$X_{MAX} \div (1.25 \cdot X_{MAX}) = 0.8 \tag{2}$$

By thus reducing the gain of the delta-sigma modulator 3 to 1/A, the occurrence of an overload situation is prevented. Instead, by providing gain A (which is called the "scaling coefficient") to the subsequent filter circuit 4, the gain limited in the delta-sigma modulator 3 can be compensated. By performing such scaling, noise can be effectively reduced. In the example in equations (1) and (2), the scaling coefficient A is 1.25.

The variable gain amplifier 1 can set an arbitrary gain by a control signal CS1 from the DSP 2. Here, as an example, the case is described where the maximum value of the amplitude level of an input signal to the variable gain amplifier 1 is given as $V_{MAX}$, the gain of the variable gain amplifier 1 is given as Ga, and the scaling coefficient is given as Aa.

In this case, if the maximum value of the amplitude level of an input signal X to the delta-sigma modulator 3 is given as $X_{MAX}$, the maximum value $X_{MAX}$ can be expressed as follows:

$$X_{MAX} = V_{MAX} \cdot Ga$$

Hence, the amplitude level of an output signal Y from the delta-sigma modulator 3 shown in FIG. 12 can be represented by the following transfer function if the scaling coefficient is given as A:

$$\begin{aligned} Y &= X_{MAX}/Aa + (1 - Z^{-1})Q \\ &= V_{MAX} \cdot Ga/Aa + (1 - Z^{-1})Q. \end{aligned} \tag{3}$$

The output Dout from the filter circuit 4 is represented by the following function:

$$\begin{aligned} Dout &= Y \cdot Aa \\ &= V_{MAX} \cdot Ga + (1 - Z^{-1})Q \cdot Aa \end{aligned} \tag{4}$$

The result of equation (4) shows that the quantization noise contained in the output signal from the delta-sigma modulator 3 is proportional to the scaling coefficient Aa. Thus, it can be seen that to reduce the quantization noise the scaling coefficient Aa needs to be set as low as possible. In FIG. 12, the scaling coefficient of the delta-sigma modulator 3 is set to a value that does not cause an overload situation even if the maximum signal amplitude level to be inputted to the delta-sigma modulator 3, i.e., the signal of $V_{MAX} \cdot Ga$, is inputted to the delta-sigma modulator 3.

FIG. 14 is a block diagram showing, as a second conventional example, an A/D conversion circuit with an AGC circuit, which employs a single-stage first-order delta-sigma modulator 3. The A/D conversion circuit is composed of an AGC circuit 12, the delta-sigma modulator 3, and a digital filter circuit 13.

An external analog input signal is first inputted to the AGC circuit 12. The AGC circuit 12 is composed of a variable gain amplifier 1 which inputs the analog signal and whose amplification factor is changed by a control signal CS5; a level detection circuit 15 that detects an amplitude of an output signal from the variable gain amplifier 1 and outputs a signal level according to the amplitude; a reference level generator 16 that outputs a reference level; and a comparator 14 that compares the signal level outputted from the level detection circuit 15 with the reference level, and outputs a control signal CS5 to the variable gain amplifier 1 according to the comparison result. By this, the AGC circuit 12 functions to output, even if the level of the analog input signal is changed, the signal from the variable gain amplifier 1 with the peak value of the signal level being maintained at ±V1.

The first-order delta-sigma modulator 3 is composed of an adder-subtractor 8 that subtracts a feedback reference level ($+V_{REF}$ or $-V_{REF}$) from an output signal from the AGC circuit 12; an integrator 9 that inputs an output signal from the adder-subtractor 8; a quantizer 6 that quantizes an output from the integrator 9 to a 1-bit digital signal; and a level fixed feedback circuit 31 that generates the feedback reference level based on a digital output signal Y from the quantizer 6. The integrator 9 and the adder-subtractor 8 compose an integration circuit 5. The level fixed feedback circuit 31 is composed of a 1-bit DA converter.

A 1-bit output signal Y from the delta-sigma modulator 3 is inputted, as a digital code, to the digital filter circuit 13 where the low-frequency component of the output signal Y, which corresponds to an analog input signal component, is extracted, and the extracted low-frequency component is converted into digital data of a predetermined number of bits.

The scaling coefficient of the above delta-sigma modulation type A/D conversion circuit is set to A (A is an arbitrary numeric value greater than 1). The scaling coefficient A is obtained by setting, as described above, the magnitude of the feedback reference level such that the output holding level of the AGC circuit 12 with respect to the feedback reference level is 1/A. The gain A of the digital filter circuit 13 is obtained by allowing the impulse response coefficient of the digital filter circuit 13 to have a gain.

Note that in FIG. 14 the symbol Q denotes a quantization error generated between before and after the quantizer 6.

In FIG. 14, the output holding level of the AGC circuit 12 is determined according to a dynamic range necessary for the output of the AGC circuit 12. Thus, it is often the case that the AGC circuit 12 is used with a plurality of holding amplitude levels being switched from one to another.

In such a delta-sigma modulation type A/D conversion circuit having a switching function of the output holding amplitude level of the AGC circuit 12, the feedback reference level, i.e., the scaling coefficient A, of the delta-sigma modulator 3 is set in accordance with the maximum value of the output holding level of the AGC circuit 12, to prevent the occurrence of an overload situation.

Patent document 1: Japanese Laid-Open Patent Publication No. 08-018457

Now, the case is described where in the delta-sigma modulation circuit with a variable gain amplifier, which employs a single-stage first-order delta-sigma modulator 3, as shown in FIG. 12 as the first conventional example, the gain of the variable gain amplifier 1 is switched between Ga, Gb, and Gc. The scaling coefficient A of the delta-sigma modulator 3 is set in accordance with $V_{MAX}$·Ga which represents the maximum value of the amplitude level of an input signal X. If the value of the scaling coefficient A is given as Aa fixed, the outputs Dout from the filter circuit 4 for three gain settings Ga, Gb, and Gc are represented by the following functions.

First, if the outputs from the first-order delta-sigma modulator 3 are given as Ya, Yb, and Yc, respectively, the outputs Ya, Yb, and Yc can be expressed as follows:

$$Ya = V_{MAX} \cdot Ga/Aa + (1-Z^{-1})Q \quad (5)$$

$$Yb = V_{MAX} \cdot Gb/Aa + (1-Z^{-1})Q \quad (6)$$

$$Yc = V_{MAX} \cdot Gc/Aa + (1-Z^{-1})Q \quad (7)$$

If the outputs from the filter circuit 4 are given as Douta, Doutb, and Doutc, respectively, the outputs Douta, Doutb, and Doutc can be expressed as follows:

$$Douta = V_{MAX} \cdot Ga + (1-Z^{-1})Q \cdot Aa \quad (8)$$

$$Doutb = V_{MAX} \cdot Gb + (1-Z^{-1})Q \cdot Aa \quad (9)$$

$$Doutc = V_{MAX} \cdot Gc + (1-Z^{-1})Q \cdot Aa \quad (10)$$

Comparing between equations (8) to (10), although the gain settings Ga to Gc for the signal component are different from one another, $(1-Z^{-1})Q \cdot Aa$ which represents the quantization noise component is fixed, the conditions of which are shown in FIG. 15.

FIG. 15 is a diagram showing the amplitude level of an output signal Y from the delta-sigma modulator 3 and the noise level contained in the amplitude level of the output signal Y, with respect to the amplitude level of an input signal X to the delta-sigma modulator 3. By reducing the gain of the variable gain amplifier 1 from Ga to Gb, and then to Gc, the difference between the signal level and the quantization noise level is reduced; accordingly, it can be seen that the dynamic range is reduced.

Now, the case is described where in the A/D conversion circuit with an AGC circuit, which employs a single-stage first-order delta-sigma modulator, as shown in FIG. 14 as the second conventional example, the AGC circuit 12 has the function of switching three output holding amplitude levels from one to another by a control signal CS1 from the DSP 2.

FIG. 16 is a diagram showing the output amplitude level dependence of the AGC circuit 12 having the function of switching three output holding amplitude levels from one to another, with respect to the input signal amplitude level. In this case, in the A/D conversion circuit with an AGC function shown in FIG. 14, the scaling coefficient A of the delta-sigma modulator 3 is set in accordance with V1 which represents the maximum value of the output holding amplitude level. If the value of the scaling coefficient A is given as A1 fixed, the outputs Dout from the digital filter circuit 13 for three output holding amplitude levels V1, V2, and V3 are represented by the following functions.

First, if the outputs from the first-order delta-sigma modulator 3 are given as Y1, Y2, and Y3, respectively, the outputs Y1, Y2, and Y3 can be expressed as follows:

$$Y1 = V1/A1 + (1-Z^{-1})Q \quad (11)$$

$$Y2 = V2/A1 + (1-Z^{-1})Q \quad (12)$$

$$Y3 = V3/A1 + (1-Z^{-1})Q \quad (13)$$

If the outputs from the digital filter circuit 13 are given as Dout1, Dout2, and Dout3, respectively, the outputs Dout1, Dout2, and Dout3 can be expressed as follows:

$$Dout1 = V1 + (1-Z^{-1})Q \cdot A1 \quad (14)$$

$$Dout2 = V2 + (1-Z^{-1})Q \cdot A1 \quad (15)$$

$$Dout3 = V3 + (1-Z^{-1})Q \cdot A1 \quad (16)$$

Comparing between equations (14) to (16), although the signal components V1 to V3 are different from one another, $(1-Z^{-1})Q \cdot A1$ which represents the quantization noise component is fixed, the conditions of which are shown in FIG. 17. FIG. 17 is a diagram showing the amplitude level of an output signal Y from the delta-sigma modulator 3 and the noise level contained in the amplitude level of the output signal Y, with respect to the amplitude level of an input signal X to the delta-sigma modulator 3. By reducing the output holding amplitude level from V1 to V2, and then to V3, the difference between the signal level and the quantization noise level is reduced; accordingly, it can be seen that the dynamic range is reduced.

SUMMARY OF THE INVENTION

The present invention is made to solve the foregoing problems. An object of the present invention is to provide a delta-sigma modulation circuit with a gain control function, with which the optimum dynamic range can be obtained according to the setting level of a variable gain amplifier without causing the dynamic range to vary depending on the setting level of the variable gain amplifier.

To solve the foregoing problems, a delta-sigma modulation circuit with a gain control function of a first aspect comprises: a variable gain amplifier; a control unit that controls a gain of the variable gain amplifier; and a gain-variable delta-sigma modulator, wherein the control unit gain controls the delta sigma modulator.

A delta-sigma modulation circuit with a gain control function of a second aspect is such that the delta-sigma modulation circuit with a gain control function of the first aspect may further comprise a gain-variable filter circuit, wherein the control unit may gain control the filter circuit as well as the delta-sigma modulator.

In a delta-sigma modulation circuit with a gain control function of a third aspect, the delta-sigma modulator may be composed of a cascaded delta-sigma modulator.

The cascaded delta-sigma modulator may include: a delta-sigma modulation type quantization loop of a first stage having a first integration circuit that inputs an input signal and a first feedback reference level; a first quantizer that quantizes an output from the first integration circuit; and a first converter that generates the first feedback reference level based on an output from the first quantizer;

at least one delta-sigma modulation type quantization loops of second and subsequent stages, the loop being cascade connected to the delta-sigma modulation type quantization loop of the first stage, and having a second integration circuit that inputs a quantization loop-to-quantization loop signal and a second feedback reference level, the quantization loop-to-quantization loop signal being composed of a signal outputted from a given location in a delta-sigma modulation type quantization loop of a preceding stage; a second quantizer that quantizes an output from the second integration circuit; and a second converter that generates the second feedback reference level based on an output from the second quantizer; and a noise removing circuit having a delayer that delays an output from each of the delta-sigma modulation type quantization loops of the first stage and the second and subsequent stages; and a differentiator that differentiates an output from a delta-sigma modulation type quantization loop of a subsequent stage, the noise removing circuit adding the delayed outputs and the differentiated output, and outputting a value of the added outputs. In the delta-sigma modulation circuit with a gain control function, the control unit may gain control the noise removing circuit as well as the delta-sigma modulator.

In the delta-sigma modulation circuit with a gain control function of the first aspect, it is preferable that the control unit is a digital signal processor.

In the delta-sigma modulation circuit with a gain control function of the first aspect, it is preferable that the control unit include: a level detection circuit that detects an amplitude of an output signal from the variable gain amplifier and outputs a signal level according to the amplitude; a reference level generator that generates a reference level; and a comparator that compares the signal level outputted from the level detection circuit with the reference level generated by the reference level generator and then outputs, according to a comparison result, control signals for controlling gains of the variable gain amplifier and the delta-sigma modulator, thereby gain controlling the variable gain amplifier and the delta-sigma modulator.

In the delta-sigma modulation circuit with a gain control function of the second aspect, it is preferable that the control unit include: a level detection circuit that detects an amplitude of an output signal from the variable gain amplifier and outputs a signal level according to the amplitude; a reference level generator that generates a reference level; and a comparator that compares the signal level outputted from the level detection circuit with the reference level generated by the reference level generator and then outputs, according to a comparison result, control signals for controlling gains of the variable gain amplifier, the delta-sigma modulator, and the filter circuit, thereby gain controlling the variable gain amplifier, the delta-sigma modulator, and the filter circuit.

In the delta-sigma modulation circuit with a gain control function of the third aspect, it is preferable that the control unit include: a level detection circuit that detects an amplitude of an output signal from the variable gain amplifier and outputs a signal level according to the amplitude; a reference level generator that generates a reference level; and a comparator that compares the signal level outputted from the level detection circuit with the reference level generated by the reference level generator and then outputs, according to a comparison result, control signals for controlling gains of the variable gain amplifier, the delta-sigma modulator, and the noise removing circuit, thereby gain controlling the variable gain amplifier, the delta-sigma modulator, and the noise removing circuit.

In the delta-sigma modulation circuit with a gain control function of the first aspect, it is preferable that the delta-sigma modulation circuit further comprise a filter circuit, and that the control unit include: a level detection circuit that detects an amplitude of an output signal from the filter circuit and outputs a signal level according to the amplitude; a reference level generator that generates a reference level; and a comparator that compares the signal level outputted from the level detection circuit with the reference level generated by the reference level generator and then outputs, according to a comparison result, control signals for controlling gains of the variable gain amplifier and the delta-sigma modulator, thereby gain controlling the variable gain amplifier and the delta-sigma modulator.

In the delta-sigma modulation circuit with a gain control function of the second aspect, it is preferable that the control unit include: a level detection circuit that detects an amplitude of an output signal from the filter circuit and outputs a signal level according to the amplitude; a reference level generator that generates a reference level; and a comparator that compares the signal level outputted from the level detection circuit with the reference level generated by the reference level generator and then outputs, according to a comparison result, control signals for controlling gains of the variable gain amplifier, the delta-sigma modulator, and the filter circuit, thereby gain controlling the variable gain amplifier, the delta-sigma modulator, and the filter circuit.

In the delta-sigma modulation circuit with a gain control function of the third aspect, it is preferable that the delta-sigma modulation circuit further comprise a filter circuit, and that the control unit include: a level detection circuit that detects an amplitude of an output signal from the filter circuit and outputs a signal level according to the amplitude; a reference level generator that generates a reference level; and a comparator that compares the signal level outputted from the level detection circuit with the reference level generated by the reference level generator and then outputs, according to a comparison result, control signals for controlling gains of the variable gain amplifier, the delta-sigma modulator, and the noise removing circuit, thereby gain controlling the variable gain amplifier, the delta-sigma modulator, and the noise removing circuit.

In each of the above configurations, it is preferable that the reference level generator selectively output any one of a plurality of reference levels. In this case, it is preferable that the delta-sigma modulation circuit further comprise a digital signal processor that feeds to the reference level generator a control signal by which the any one of the reference levels is selected.

In the delta-sigma modulation circuit with a gain control function of the first aspect, it is preferable that the delta-sigma modulator include a circuit that generates a feedback reference level, and that the gain control of the delta-sigma modulator be performed by changing the feedback reference level.

In the delta-sigma modulation circuit with a gain control function of the second aspect, it is preferable that the filter circuit include: an amplifier; and a filter element, and that the gain control of the filter circuit be performed by changing a gain of the amplifier.

As described above, a delta-sigma modulation circuit includes: a variable gain amplifier; a control unit that controls the gain of the variable gain amplifier; and a gain variable delta-sigma modulator. By the control unit gain controlling the delta-sigma modulator, a delta-sigma modulation circuit with a gain control function can be realized with which the optimum dynamic range can be obtained according to the setting level of the variable gain amplifier without causing the dynamic range to vary depending on the setting level of the variable gain amplifier.

BRIEF DESCRIPTION OF THE DRAWINGS

FIG. 3 is a table showing control signals CS1 to CS3 and exemplary gain settings in FIG. 1;

FIG. 6 is a table showing control signals CS1 to CS3 and exemplary gain settings in FIG. 5;

FIG. 10 is a diagram showing a relationship between input and output signals to/from a delta-sigma modulator and quantization noise in FIG. 9;

DESCRIPTION OF THE PREFERRED EMBODIMENTS

Embodiments of the present invention will be described below with reference to the drawings.

Figure 1:
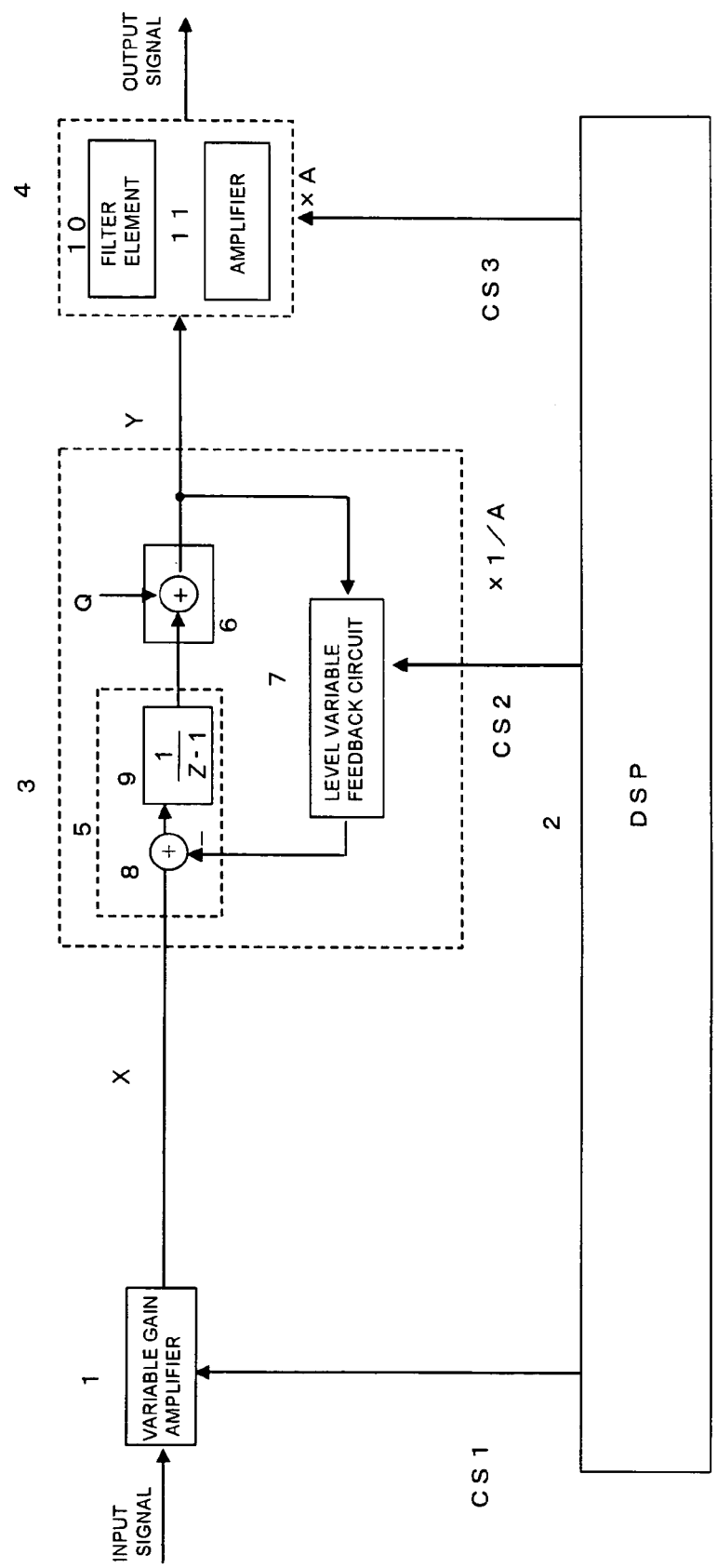
FIG. 1 is a block diagram showing a configuration of a delta-sigma modulation circuit with a gain control function, according to a first embodiment of the present invention.

FIG. 1 is a diagram showing, as a first embodiment, a configuration of a delta-sigma modulation circuit with a variable gain amplifier, which employs a single-stage first-order delta-sigma modulator.

An external signal is first inputted to a variable gain amplifier 1. The gain of the variable gain amplifier 1 is controlled by a control signal CS1 outputted from a digital signal processor (DSP) 2.

A first-order delta-sigma modulator 3 is composed of an adder-subtractor 8 that subtracts a feedback reference level ($+V_{REF}$ or $-V_{REF}$) from an output signal from the variable gain amplifier 1; an integrator 9 that inputs an output signal from the adder-subtractor 8; a quantizer 6 that quantizes an output from the integrator 9 to predetermined bits; and a level variable feedback circuit 7 that generates the feedback reference level based on a digital output signal Y from the quantizer 6. The integrator 9 and the adder-subtractor 8 compose an integration circuit 5.

An output signal from the delta-sigma modulator 3 is inputted to a filter circuit 4 where a necessary signal band is extracted. The filter circuit 4 is composed of an amplifier 11 and a filter element 10. Note that in FIG. 1 the symbol Q denotes a quantization error generated between before and after the quantizer 6.

The scaling coefficient of the delta-sigma modulator 3 is set to A (A is an arbitrary numeric value greater than 1). The scaling coefficient A is obtained by setting, as described above, the magnitude of the feedback reference level such that the maximum value of the signal amplitude level X of the delta-sigma modulator 3 with respect to the feedback reference level is 1/A.

By providing, by the amplifier 11, a gain to the filter circuit 4, the gain limited in the delta-sigma modulator 3 can be compensated.

Figure 2:
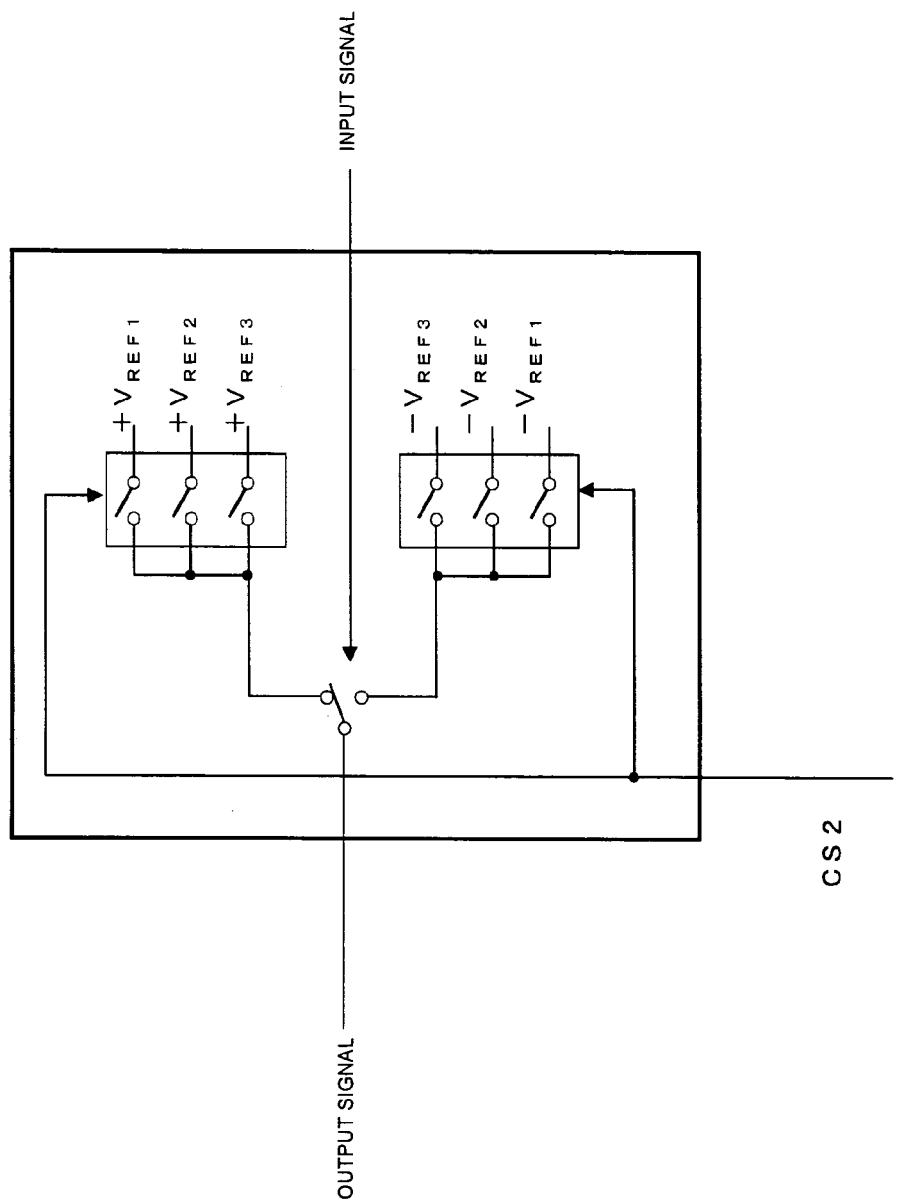
FIG. 2 is a block diagram showing a configuration of a level variable feedback circuit.

FIG. 2 is a block diagram of the level variable feedback circuit 7. The switching of the feedback reference level is done by switching voltages $\pm V_{REF1}$ to $\pm V_{REF3}$, which generate feedback reference levels, from one to another according to a control signal CS2 from the DSP 2.

The gain of the filter circuit 4 is obtained by a control signal CS3 controlling the gain of the amplifier 11.

Consequently, it becomes possible to select the scaling coefficient of the delta-sigma modulation circuit according to the gain set in the variable gain amplifier 1.

Here, the control signals CS1 to CS3 are outputted, as a 2-bit digital signal, from the DSP 2. FIG. 3 is a table showing the setting values of the gains of the variable gain amplifier 1, the delta-sigma modulator 3, and the filter circuit 4 for the control signals CS1 to CS 3, respectively.

The case is described where in the delta-sigma modulation circuit shown in FIG. 1 the gain of the variable gain amplifier 1 is switched between Ga, Gb, and Gc by a control signal CS1. Note that Ga>Gb>Gc.

The maximum value of the input signal amplitude level of the variable gain amplifier 1 is given as $V_{MAX}$, and the 2-bit digital signals are set such that control signal CS1=control signal CS2=control signal CS3.

First, if the outputs from the first-order delta-sigma modulator 3 are given as Ya, Yb, and Yc, respectively, the outputs Ya, Yb, and Yc can be expressed as follows:

$$Ya = V_{MAX} \cdot Ga \cdot 1/Aa + (1-Z^{-1})Q \quad (17)$$

$$Yb = V_{MAX} \cdot Gb \cdot Ga/(Aa \cdot Gb) + (1-Z^{-1})Q \quad (18)$$

$$Yc = V_{MAX} \cdot Gc \cdot Ga/(Aa \cdot Gc) + (1-Z^{-1})Q \quad (19)$$

If the outputs from the filter circuit 4 are given as Douta, Doutb, and Doutc, respectively, the outputs Douta, Doutb, and Doutc can be expressed as follows:

$$\begin{aligned} Douta &= Ya \cdot Aa \\ &= V_{MAX} \cdot Ga + (1-Z^{-1})Q \cdot Aa \end{aligned} \quad (20)$$

$$\begin{aligned} Doutb &= Yb \cdot Aa \cdot Gb/Ga \\ &= V_{MAX} \cdot Gb + (1-Z^{-1})Q \cdot Aa \cdot Gb/Ga \end{aligned} \quad (21)$$

$$\begin{aligned} Doutb &= Yc \cdot Aa \cdot Gc/Ga \\ &= V_{MAX} \cdot Gc + (1-Z^{-1})Q \cdot Aa \cdot Gc/Ga. \end{aligned} \quad (22)$$

The results of equations (20) to (22) show that since the coefficient of the quantization noise Q changes in proportion to the gain of the variable gain amplifier 1, the dynamic range remains constant independent of the gains Ga to Gc.

Figure 4:
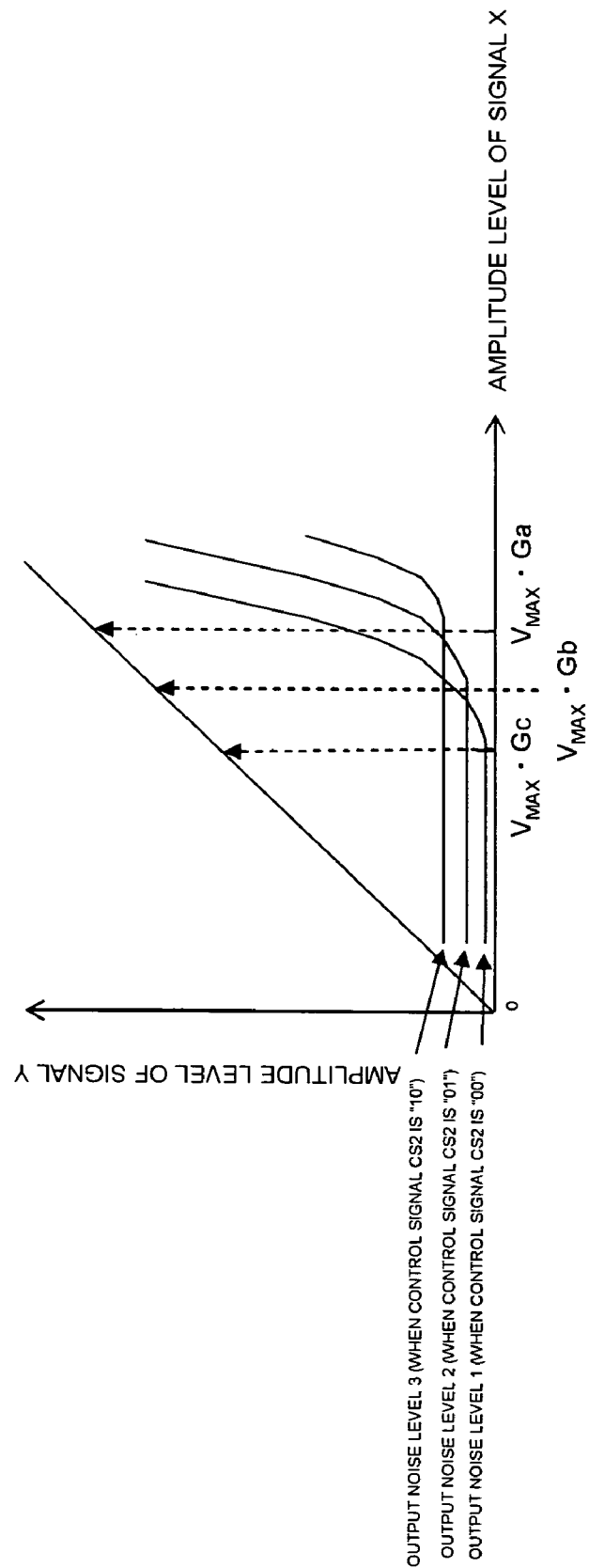
FIG. 4 is a diagram showing a relationship between input and output signals to/from a delta-sigma modulator and quantization noise in FIG. 1.

FIG. 4 shows the relationship, for the above case, between the amplitude level of an output signal Y from the delta-sigma modulator 3 and the noise level contained in the amplitude level of the output signal Y, with respect to the amplitude level of an input signal X to the delta-sigma modulator 3. Since the control signal CS1 is set to be equal to the control signal CS2, the noise levels contained in the amplitude level of the output signal Y when the variable gain amplifier 1 has gains Ga to Gc, correspond to noise levels 1 to 3, respectively. When the gain of the variable gain amplifier 1 is reduced, the noise level is also reduced, and thus, the dynamic range can be made constant.

Figure 12:
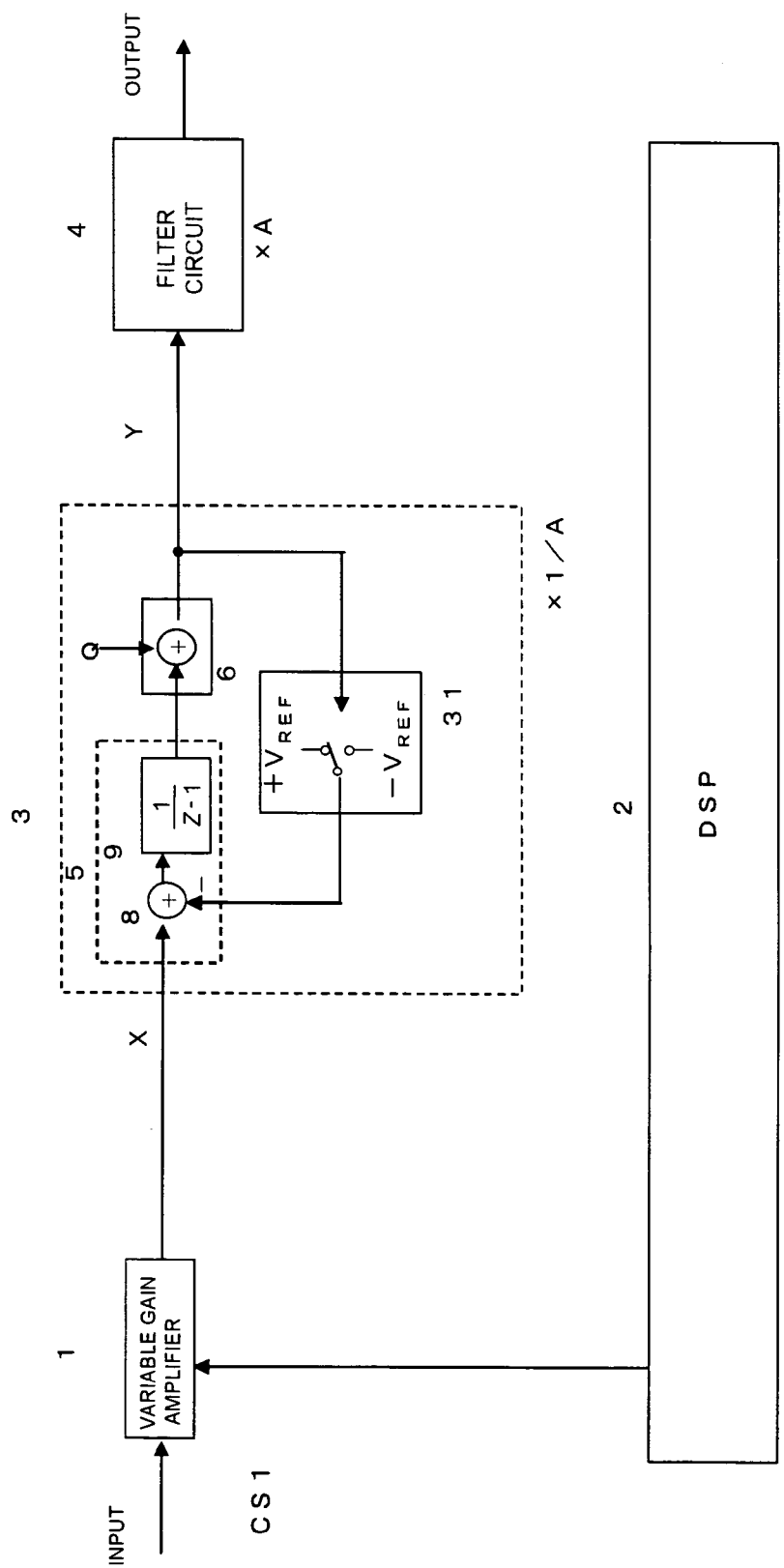
FIG. 12 is a block diagram showing a configuration of a delta-sigma modulation circuit of a first conventional example.
Figure 13:
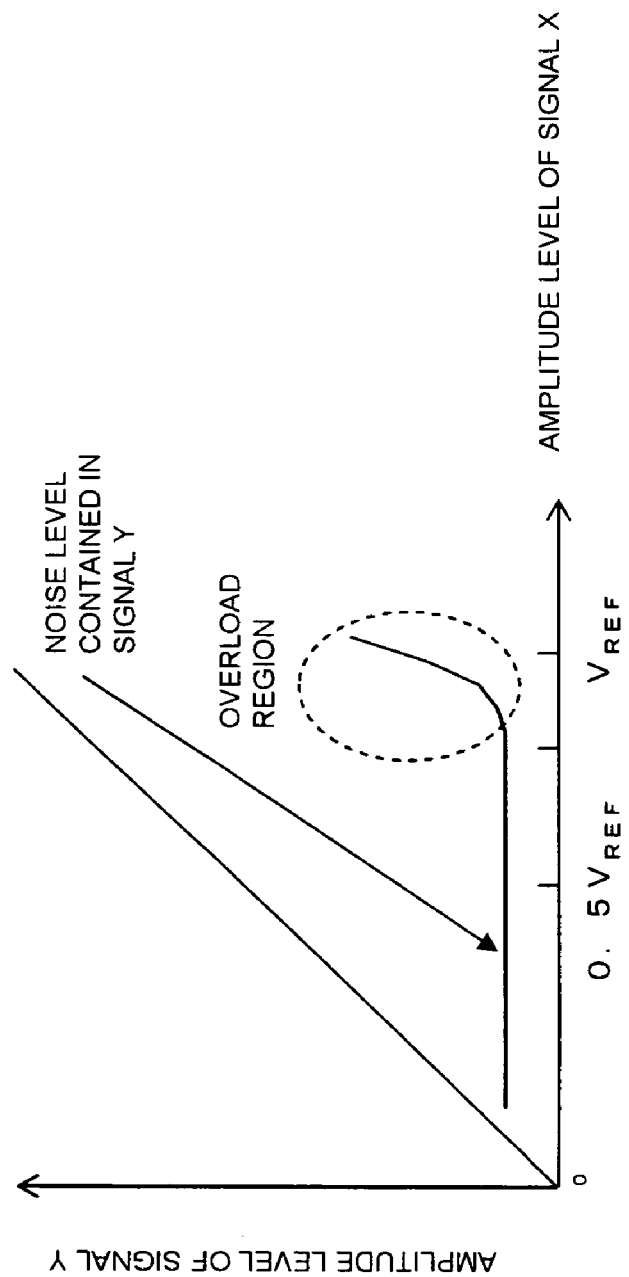
FIG. 13 is a diagram showing a relationship between input and output signals to/from a delta-sigma modulator and quantization noise in FIG. 12.

The above results show that, as in the delta-sigma modulation circuit of the first conventional example shown in FIG. 12, the optimum dynamic range can be obtained according to the setting level of the variable gain amplifier 1 without causing the dynamic range to vary depending on the setting level of the variable gain amplifier 1.

The application of the delta-sigma modulator 3 used in the present invention is not limited to the one having a single-stage first-order configuration; the delta-sigma modulator 3 can also be applied to a higher order, cascaded delta-sigma modulator. The control signals CS1 to CS3 may not be independent and the same signal may be outputted as the control signals CS1 to CS3.

When the present invention is applied to an A/D converter, the variable gain amplifier 1 and the delta-sigma modulator 3 each are composed an analog circuit, and the filter circuit is composed of a digital filer circuit. When the present invention is applied to a D/A converter, the variable gain amplifier 1 and the delta-sigma modulator 3 each are composed of a digital circuit, and the filter circuit is composed of an analog filter circuit. The reference level of the feedback circuit is generated as a digital value.

Figure 5:
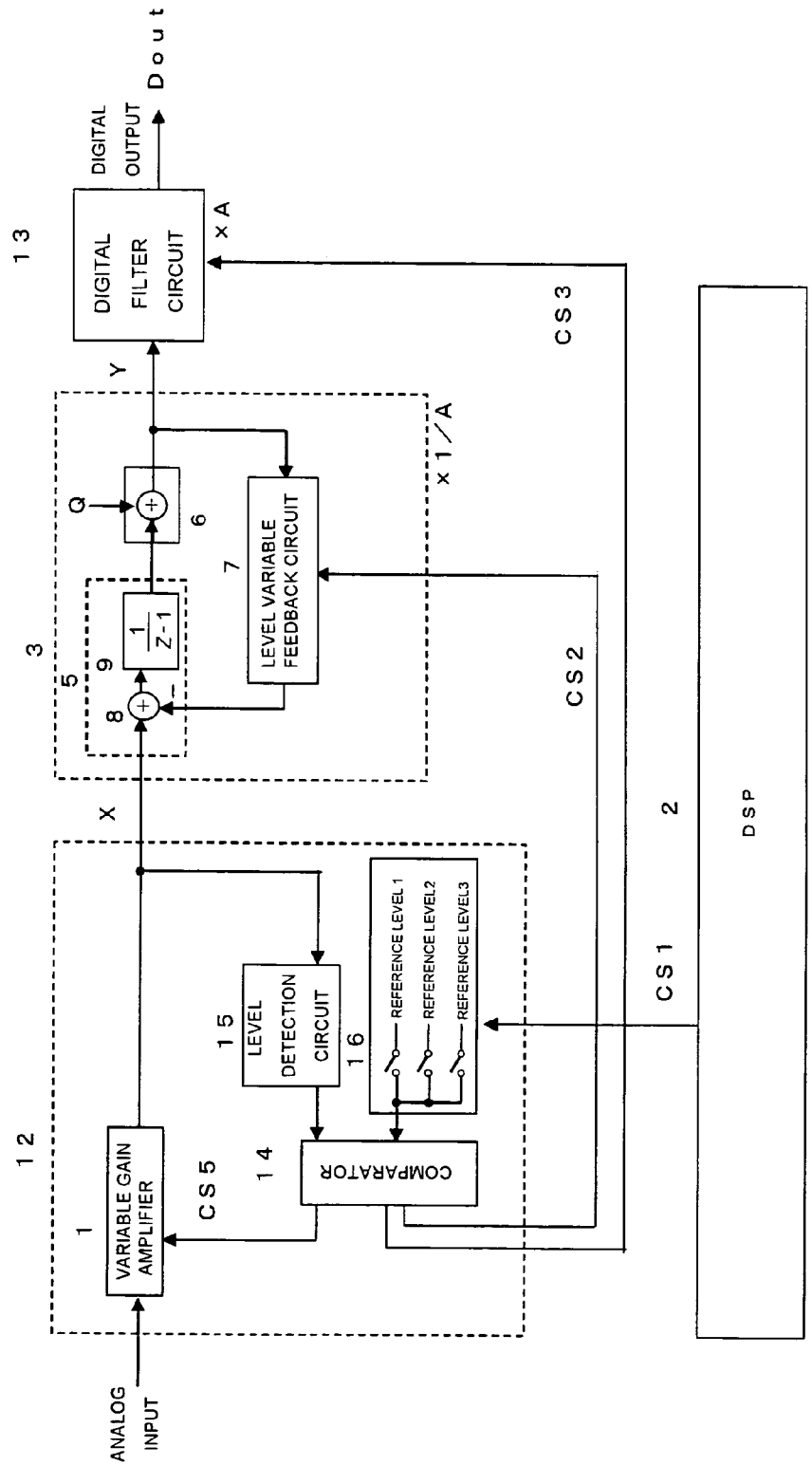
FIG. 5 is a block diagram showing a configuration of a delta-sigma modulation circuit with a gain control function, according to a second embodiment of the present invention.

FIG. 5 is a block diagram showing, as a second embodiment of the present invention, an A/D conversion circuit with AGC circuit, which employs a single-stage first-order delta-sigma modulator.

The A/D conversion circuit is composed of an AGC circuit 12, a delta-sigma modulator 3, and a digital filter circuit 13.

An external analog input signal is first inputted to the AGC circuit 12. The AGC circuit 12 is composed of a variable gain amplifier 1 which inputs the analog signal and whose amplification factor is changed by a control signal CS5; a level detection circuit 15 that detects an amplitude of an output signal from the variable gain amplifier 1 and outputs a signal level according to the amplitude; a reference level generator 16 that outputs a reference level; and a comparator 14 that compares the signal level outputted from the level detection circuit 15 with the reference level, and outputs a control signal CS5 to the variable gain amplifier 1 according to the comparison result. The AGC circuit 12 functions to output, even if the amplitude of the analog input signal is changed, the signal from the variable gain amplifier 1 with the peak amplitude of the signal amplitude being maintained at a predetermined level. When the output from the level detection circuit 15 exceeds the reference level, the comparator 14 simultaneously generates control signals CS2 and CS3. The switching of the output holding level is done by switching reference levels 1 to 3 from one to another according to a control signal CS1.

The first-order delta-sigma modulator 3 is composed of an adder-subtractor 8 that subtracts a feedback reference level ($+V_{REF}$ or $-V_{REF}$) from an output signal from the AGC circuit 12; an integrator 9 that inputs an output signal from the adder-subtractor 8; a quantizer 6 that quantizes an output from the integrator 9 to a 1-bit digital signal; and a level variable feedback circuit 7 that generates the feedback reference level based on a digital output signal Y from the quantizer 6. The integrator 9 and the adder-subtractor 8 compose an integration circuit 5. The level variable feedback circuit 7 is composed of a 1-bit DA converter. A 1-bit output signal Y from the delta-sigma modulator 3 is inputted, as a digital code, to the digital filter circuit 13 where the low-frequency component of the output signal Y, which corresponds to an analog input signal component, is extracted, and the extracted low-frequency component is converted into digital data of a predetermined number of bits.

The scaling coefficient of the above delta-sigma modulation type A/D conversion circuit is set to A (A is an arbitrary numeric value greater than 1). The scaling coefficient A is obtained by setting, as described above, the magnitude of the feedback reference level such that the output holding level of the AGC circuit 12 with respect to the feedback reference level is 1/A. The gain A of the digital filter circuit 13 is obtained by allowing the impulse response coefficient of the digital filter circuit 13 to have a gain. As shown in FIG. 2, the switching of the feedback reference level is done by switching voltages $\pm V_{REF1}$ to $\pm V_{REF3}$, which generate feedback reference levels in the level variable feedback circuit 7, from one to another according to a control signal CS2 from the DSP 2.

The gain of the digital filter circuit 13 is obtained by switching the impulse response coefficient according to a control signal CS3.

Consequently, it becomes possible to select the scaling coefficient of the delta-sigma modulation circuit according to the output holding level switched in the AGC circuit 12.

Here, the control signals CS1 to CS3 are outputted, as a 2-bit digital signal, from the DSP 2. FIG. 6 is a table showing the setting values of the output holding level of the AGC circuit 12, the gain of the delta-sigma modulator 3, and the gain of the digital filter circuit 13 for the control signals CS1 to CS 3, respectively.

The case is described where in the delta-sigma modulation circuit shown in FIG. 5 the output holding level of the AGC circuit 12 is switched between V1, V2, and V3 by a control signal CS1. Note that V1>V2>V3. The 2-bit digital signals are set such that control signal CS1=control signal CS2=control signal CS3.

First, if the outputs from the first-order delta-sigma modulator 3 are given as Y1, Y2, and Y3, respectively, the outputs Y1, Y2, and Y3 can be expressed as follows:

$$Y1 = V1 \cdot 1/A1 + (1-Z^{-1})Q \quad (23)$$

$$Y2 = V2 \cdot V1/(A1 \cdot V2) + (1-Z^{-1})Q \quad (24)$$

$$Y3 = V3 \cdot V1/(A1 \cdot V3) + (1-Z^{-1})Q \quad (25)$$

If the outputs from the digital filter circuit 13 are given as Dout1, Dout2, and Dout3, respectively, the outputs Dout1, Dout2, and Dout3 can be expressed as follows:

$$Dout1 = Y1 \cdot A1 \quad (26)$$
$$= V1 + (1-Z^{-1})Q \cdot A1$$

$$Dout2 = Y2 \cdot A1 \cdot V2/V1 \quad (27)$$
$$= V2 + (1-Z^{-1})Q \cdot A1 \cdot V2/V1$$

$$Dout3 = Y3 \cdot A1 \cdot V3/V1 \quad (28)$$
$$= V3 + (1-Z^{-1})Q \cdot A1 \cdot V3/V1$$

The results of equations (26) to (28) show that since the coefficient of the quantization noise Q changes in proportion to the output holding level of the AGC circuit 12, the dynamic range remains constant independent of the output holding levels V1 to V3.

Figure 7:
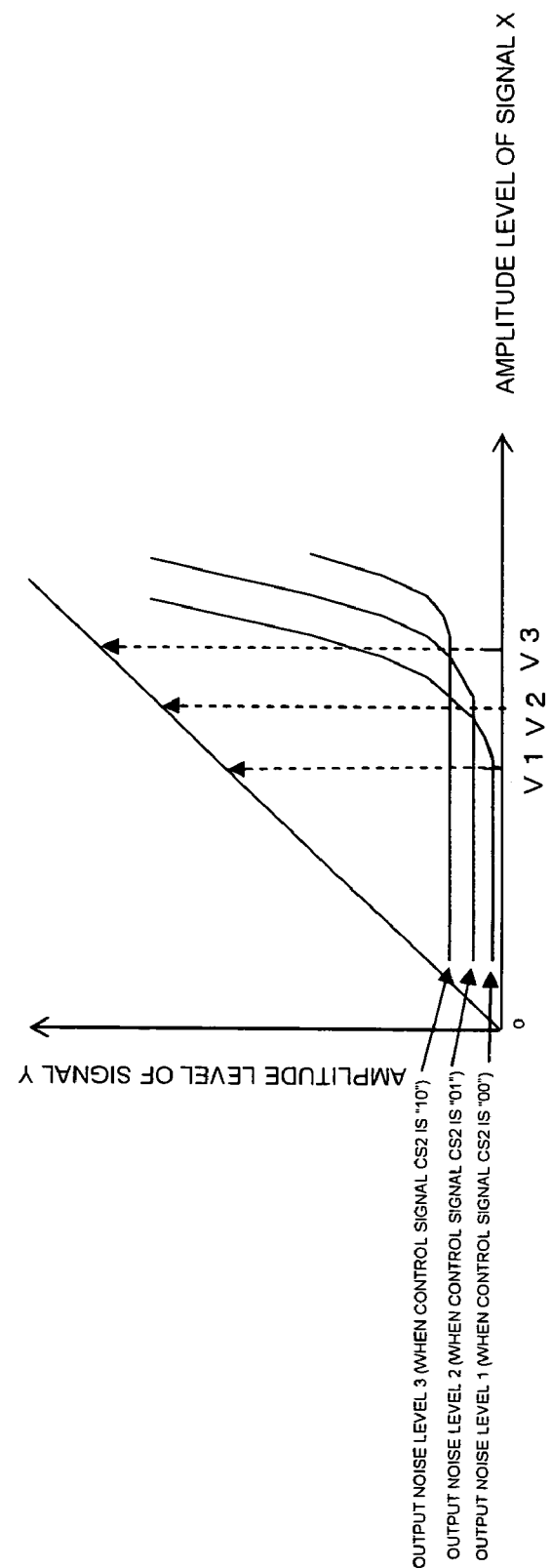
FIG. 7 is a diagram showing a relationship between input and output signals to/from a delta-sigma modulator and quantization noise in FIG. 5.

FIG. 7 shows the relationship, for the above case, between the amplitude level of an output signal Y from the delta-sigma modulator 3 and the noise level contained in the amplitude level of the output signal Y, with respect to the amplitude level of an input signal X to the delta-sigma modulator 3. Since the control signal CS1 is set to be equal to the control signal CS2, the noise levels contained in the amplitude level of the output signal Y when the AGC circuit 12 has output holding levels V1 to V3, correspond to noise levels 1 to 3, respectively. When the gain of the variable gain amplifier 1 is reduced, the noise level is also reduced, and thus, the dynamic range can be made constant.

Figure 14:
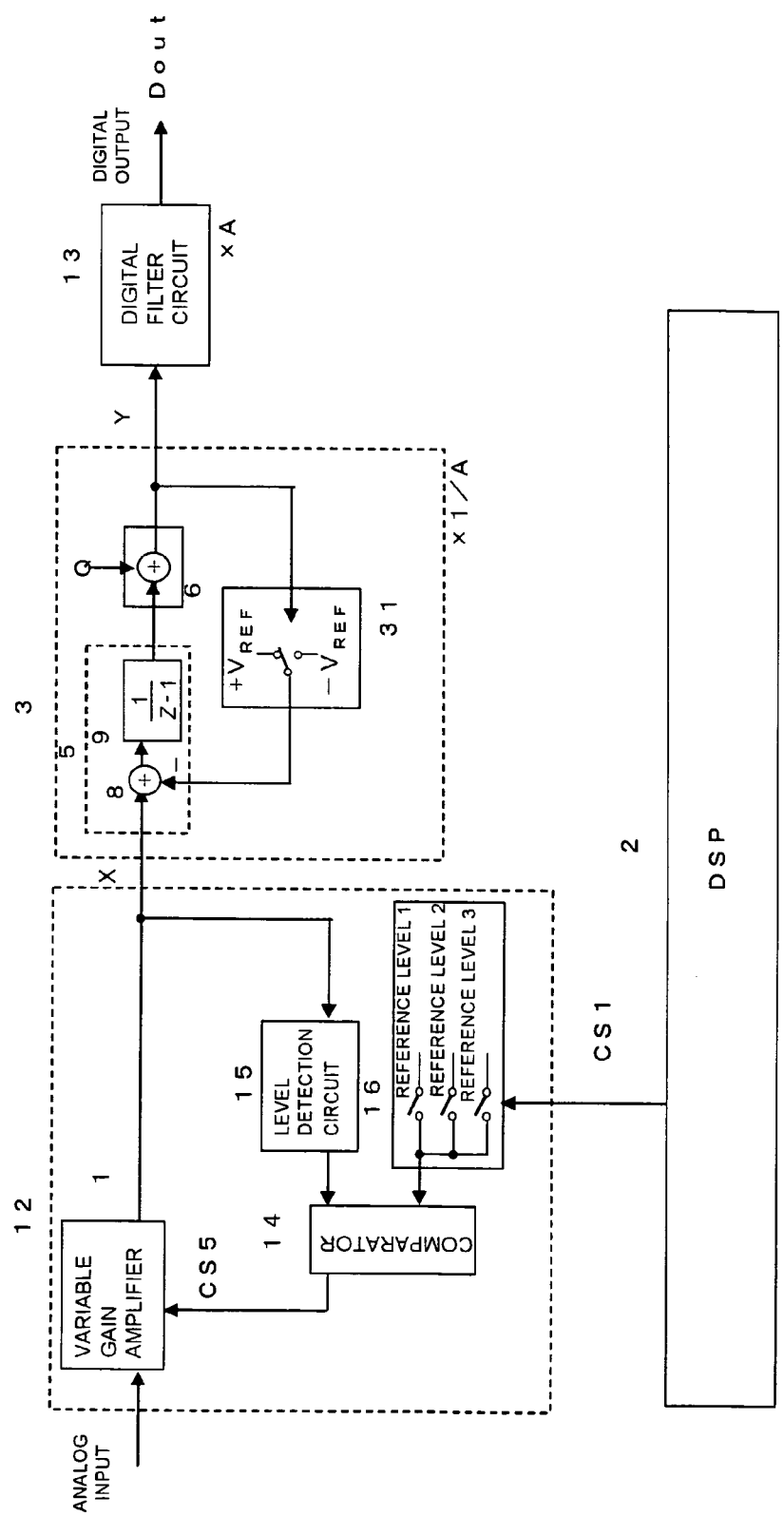
FIG. 14 is a block diagram showing a configuration of a delta-sigma modulation circuit of a second conventional example.
Figure 15:
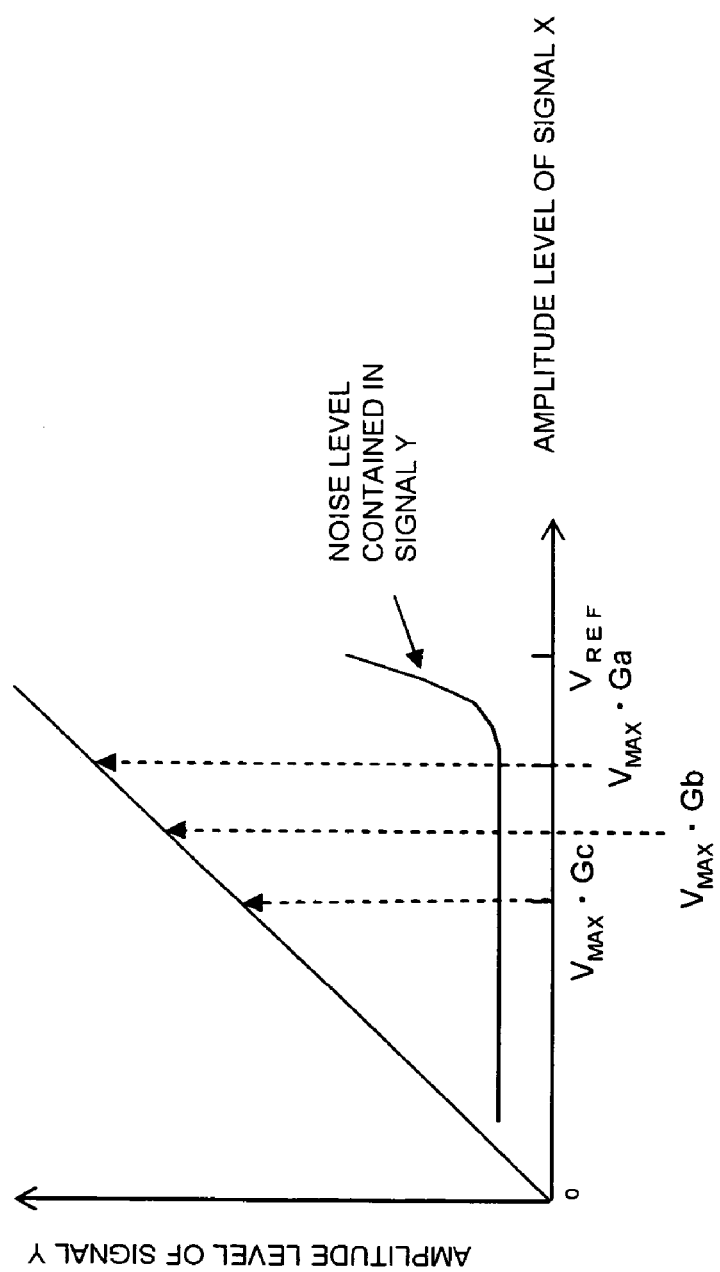
FIG. 15 is a diagram showing a relationship between input and output signals to/from a delta-sigma modulator and quantization noise in FIG. 12.
Figure 16:
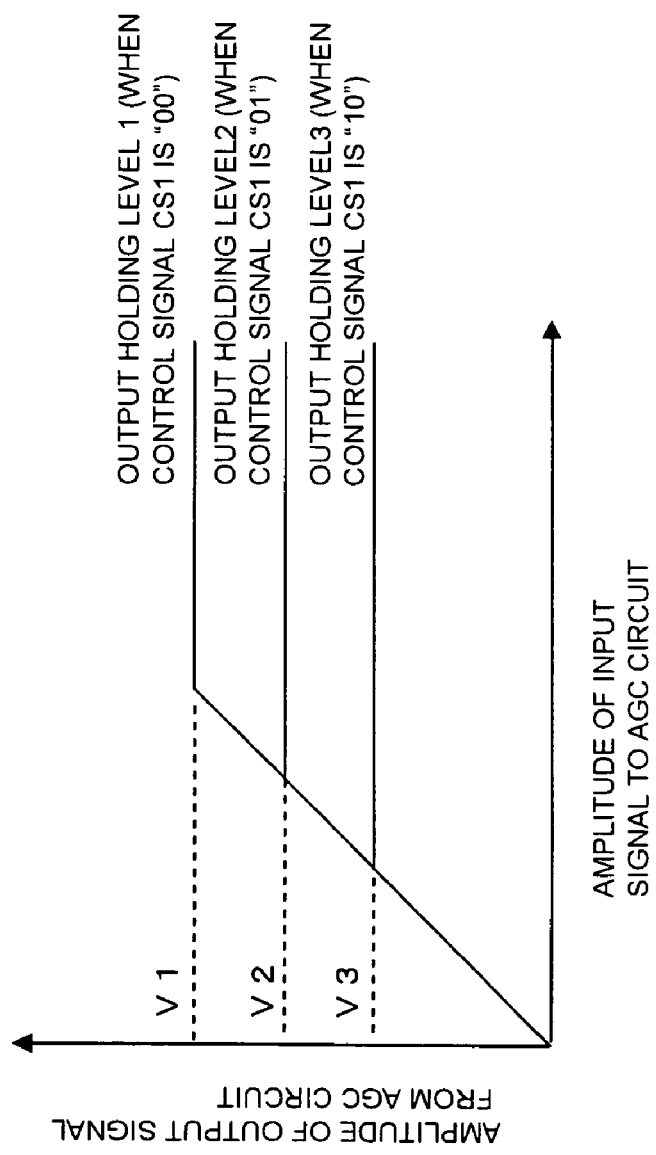
FIG. 16 is a characteristic diagram showing the analog input level dependence of an output holding level of an AGC circuit shown in FIG. 14.
Figure 17:
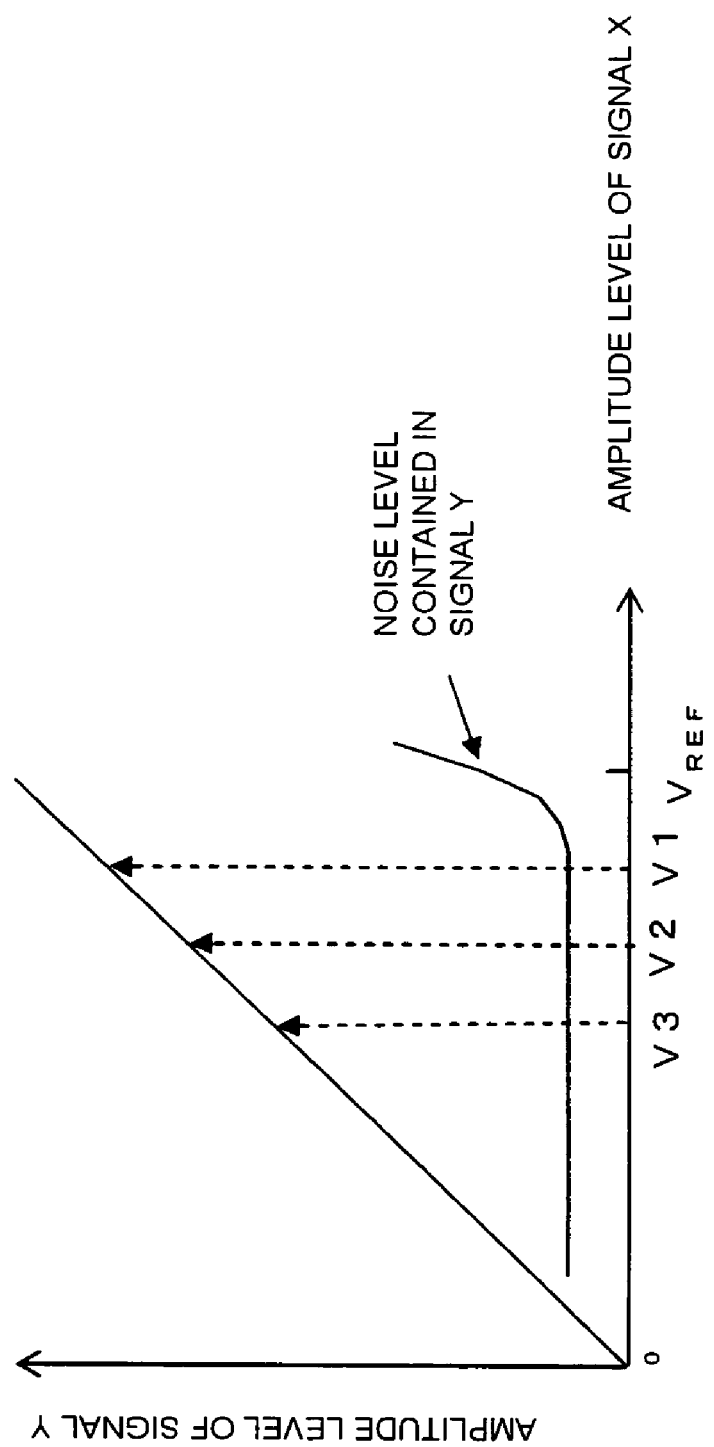
FIG. 17 is a diagram showing a relationship between input and output signals to/from a delta-sigma modulator and quantization noise in FIG. 14.

The above results show that, as in the delta-sigma modulation circuit of the second conventional example shown in FIG. 14, the optimum dynamic range can be obtained according to the setting level of the variable gain amplifier 1 without causing the dynamic range to vary depending on the setting level of the variable gain amplifier 1.

The application of the delta-sigma modulator 3 used in the present invention is not limited to the one having a single-stage first-order configuration; the delta-sigma modulator 3 can also be applied to a higher order, cascaded delta-sigma modulator. The control signals CS1 to CS3 may not be independent and the same signal may be outputted as the control signals CS1 to CS3.

Figure 8:
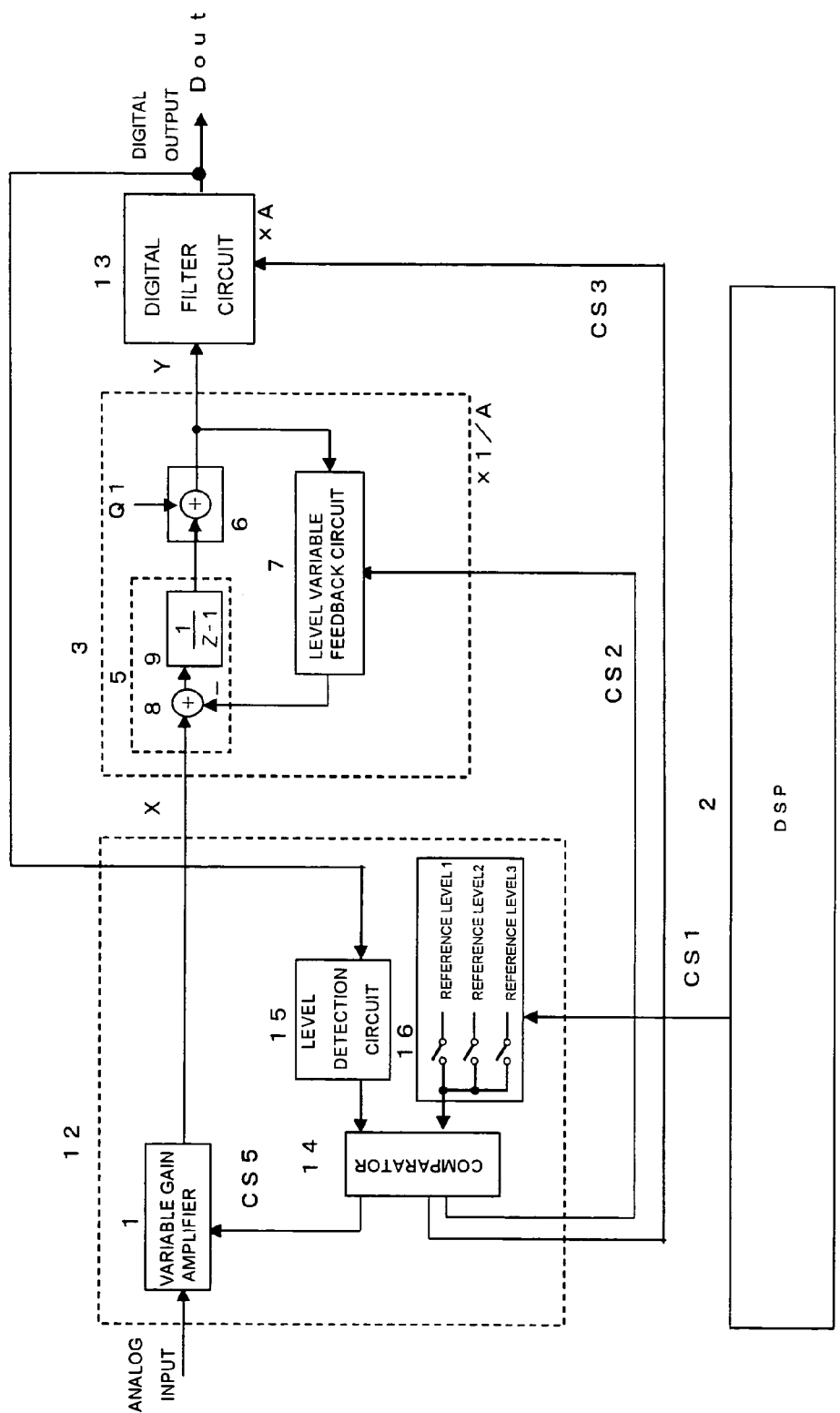
FIG. 8 is a block diagram showing an exemplary configuration which uses, in the second embodiment of the present invention, a different AGC circuit from that in FIG. 1.

The AGC circuit 12 used in the delta-sigma modulation circuit of the present invention may be composed of, as shown in FIG. 8, a variable gain amplifier 1 which inputs an analog signal and whose amplification factor is changed by a control signal CS5; a level detection circuit 15 that detects an amplitude of an output signal from a digital filter circuit 13 and outputs a signal level according to the amplitude; a reference level generator 16 that outputs a reference level; and a comparator 14 that compares the signal level outputted from the level detection circuit 15 with a reference level, and outputs a control signal CS5 to the variable gain amplifier 1 according to the comparison result.

Figure 9:
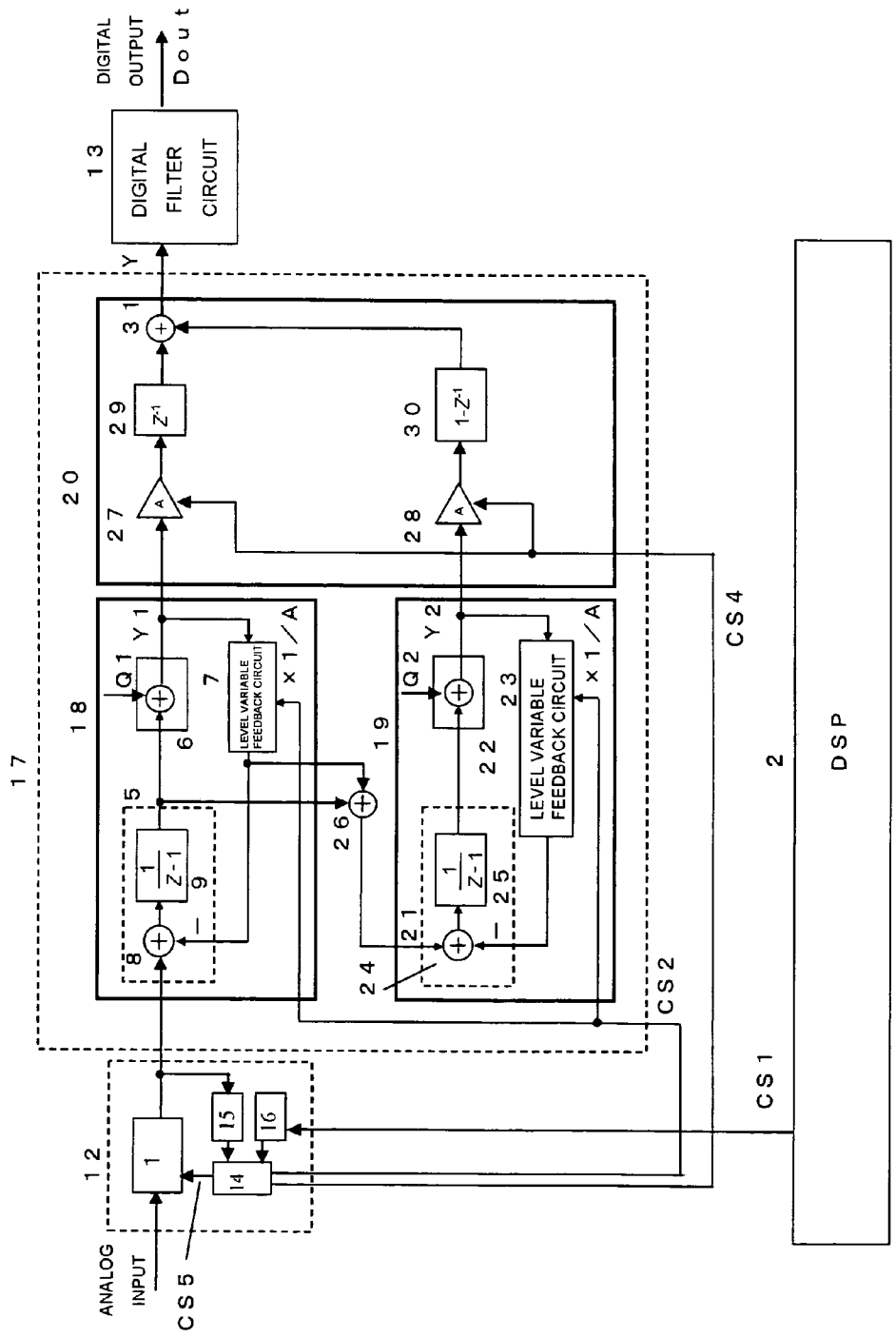
FIG. 9 is a block diagram showing a configuration of a delta-sigma modulation circuit with a gain control function, according to a third embodiment of the present invention.

FIG. 9 is a block diagram showing, as a third embodiment of the present invention, an A/D converter with an AGC circuit, which employs a cascaded delta sigma modulator.

An external analog input signal is first inputted to the AGC circuit 12. The AGC circuit 12 is composed of a variable gain amplifier 1 which inputs the analog signal and whose amplification factor is changed by a control signal CS5; a level detection circuit 15 that detects an amplitude of an output signal from the variable gain amplifier 1 and outputs a signal level according to the amplitude; a reference level generator 16 that outputs a reference level; and a comparator 14 that compares the signal level outputted from the level detection circuit 15 with the reference level, and outputs a control signal CS5 to the variable gain amplifier 1 according to the comparison result. The AGC circuit 12 functions to output, even if the amplitude of the analog input signal is changed, the signal from the variable gain amplifier 1 with the peak amplitude of the signal amplitude being maintained at a predetermined level. When the output from the level detection circuit 15 exceeds the reference level, the comparator 14 simultaneously generates control signals CS2 and CS4. The switching of the output holding level is done by switching reference levels 1 to 3 from one to another according to a control signal CS1.

A 1:1 cascaded delta-sigma modulator 17 includes a first-stage delta-sigma modulation type quantization loop 18 having a first-order integration circuit 5; a second-stage delta-sigma modulation type quantization loop 19 having a first-order integration circuit 21; and a noise removing circuit 20.

The first-stage first-order delta-sigma modulation type quantization loop 18 is composed of an adder-subtractor 8 that subtracts a feedback reference level generated by a level variable feedback circuit 7 from an output signal from the AGC circuit 12; an integrator 9 that inputs an output signal from the adder-subtractor 8; a local quantizer 6 that quantizes an output from the integrator 9 to a 1-bit digital signal; and the level variable feedback circuit 7 that generates the feedback reference level based on a digital output signal Y1 from the local quantizer 6. The integration circuit 5 is composed of the integrator 9 and the adder-subtractor 8. The level variable feedback circuit 7 is composed of a 1-bit DA converter.

The second-stage first-order delta-sigma modulation type quantization loop 19 is composed of an adder-subtractor 26 that obtains a difference signal between an input to the local quantizer 6 of the first-stage delta-sigma modulation type quantization loop 18 and an output from the level variable feedback circuit 7, i.e., an quantization error Q1 generated in the local quantizer 6 of the first-stage delta-sigma modulation type quantization loop 18; an adder-subtractor 24 that subtracts a feedback reference level generated by a level variable feedback circuit 23 from the difference signal which is an output signal from the adder-subtractor 26; an integrator 25 that inputs an output signal from the adder-subtractor 24; a local quantizer 22 that quantizes an output from the integrator 25 to a 1-bit digital signal; and the level variable feedback circuit 23 that generates the feedback reference level based on a digital output signal Y2 from the local quantizer 22. The integration circuit 21 is composed of the integrator 25 and the adder-subtractor 24. The level variable feedback circuit 23 is composed of a 1-bit DA converter.

The scaling coefficient of each of the first-stage and second-stage delta-sigma modulation type quantization loops 18 and 19 is set to A (A is an arbitrary numeric value greater than 1). Consequently, in each of the first-stage and second-stage delta-sigma modulation type quantization loops 18 and 19, the gain is limited to 1/A.

Note that in FIG. 9 the symbol Q1 denotes a quantization error generated between before and after the local quantizer 6, and the symbol Q2 denotes a quantization error generated between before and after the local quantizer 22.

The noise removing circuit 20 is connected to receive output signals Y1 and Y2 from the delta-sigma modulation type quantization loops 18 and 19, respectively. A delayer 29 is connected to receive the output signal Y1 through an amplifier 27, and functions to time-delay, when the data of the output signal Y1 is sent to an adder 31, the data of the output signal Y2. A differentiator 30 receives the output signal Y2 through an amplifier 28, and is composed of a digital differentiator that performs differentiation by a method conventionally known in the art. An output from the digital differentiator is added to an output from the delayer 29 by the adder 31, and the resulting signal becomes an output signal Y from the 1:1 cascaded delta-sigma modulator 17. The output signal Y is fed, as a digital code, to a digital (decimation) filter circuit 13. The gain of each of the amplifiers 27 and 28 included in the noise removing circuit 20 is set to A.

The amplifiers setting the gain of the noise removing circuit 20 correspond to a scale compensation means of compensating the gains limited in the first-stage and second-stage delta-sigma modulation type quantization loops 18 and 19. The scaling coefficient of the delta-sigma modulator 17 is set to A (A is an arbitrary numeric value greater than 1). The scaling coefficient A is obtained by setting, as described above, the magnitude of the feedback reference level such that the output holding level of the AGC circuit 12 with respect to the feedback reference level is 1/A.

As shown in FIG. 2, the switching of the feedback reference level is done by switching voltages $\pm V_{REF1}$ to $\pm V_{REF3}$, which generate feedback reference levels in the level variable feedback circuit 7, from one to another according to a control signal CS2 from the DSP 2. The gain of the noise removing circuit 20 is obtained by switching the gains of the amplifiers 27 and 28 from one to the other according to a control signal CS4.

Consequently, it becomes possible to select the scaling coefficient of the delta-sigma modulator 17 according to the holding level switched in the AGC circuit 12.

Here, the control signals CS1, CS2, and CS4 are outputted, as a 2-bit digital signal, from the DSP 2. FIG. 10 is a table showing the setting values of the output holding level of the AGC circuit 12, the gain of the delta-sigma modulator 17, and the gain of the noise removing circuit 20 for the control signals CS1, CS2, and CS4, respectively.

The case is described wherein the delta-sigma modulation circuit shown in FIG. 9 the output holding level of the AGC circuit 12 is switched between V1, V2, and V3 by a control signal CS1. Note that V1>V2>V3. The 2-bit digital signals are set such that control signal CS1=control signal CS2=control signal CS3.

First, if the outputs from the first-order delta-sigma modulator 17 are given as Y1, Y2, and Y3, respectively, the outputs Y1, Y2, and Y3 can be expressed as follows:

$$Y1 = V1 + (1-Z^{-1})Q2 \cdot A1 \qquad (29)$$

$$Y2 = V2 + (1-Z^{-1})Q2 \cdot A1 \cdot V2/V1 \qquad (30)$$

$$Y3 = V3 + (1-Z^{-1})Q2 \cdot A1 \cdot V3/V1 \qquad (31)$$

If the outputs from the digital filter circuit 13 are given as Dout1, Dout2, and Dout3, respectively, the outputs Dout1, Dout2, and Dout3 can be expressed as follows:

$$Dout1 = Y1 = V1 + (1-Z^{-1})Q2 \cdot A1 \qquad (32)$$

$$Dout2 = Y2 = V2 + (1-Z^{-1})Q2 \cdot A1 \cdot V2/V1 \qquad (33)$$

$$Dout3 = Y3 = V3 + (1-Z^{-1})Q2 \cdot A1 \cdot V3/V1 \qquad (34)$$

The results of equations (32) to (34) show that since the coefficient of the quantization noise Q2 changes in proportion to the output holding level of the AGC circuit 12, the dynamic range remains constant independent of the output holding levels V1 to V3.

The above results show that, as in the delta-sigma modulation circuits of the first and second embodiments, the optimum dynamic range can be obtained according to the setting level of the variable gain amplifier 1 without causing the dynamic range to vary depending on the setting level of the variable gain amplifier 1.

The application of the delta-sigma modulator 17 used in the present invention is not limited to the one having a single-stage first-order configuration; the delta-sigma modulator 17 can also be applied to a higher order, cascaded delta-sigma modulator. The control signals CS1, CS2, and CS4 may not be independent and the same signal may be outputted as the control signals CS1, CS2, and CS4.

The present invention can also be applied to an n-stage $X_1 : X_2 : \ldots : X_n$ cascaded delta-sigma modulator, such as the one in which an integration circuit of a delta-sigma modulation type quantization loop of each stage is of the $X_1$-th order, $X_2$-th order, ... $X_n$-th order. The quantizer and the DA converter may use a large number of bits.

Figure 11:
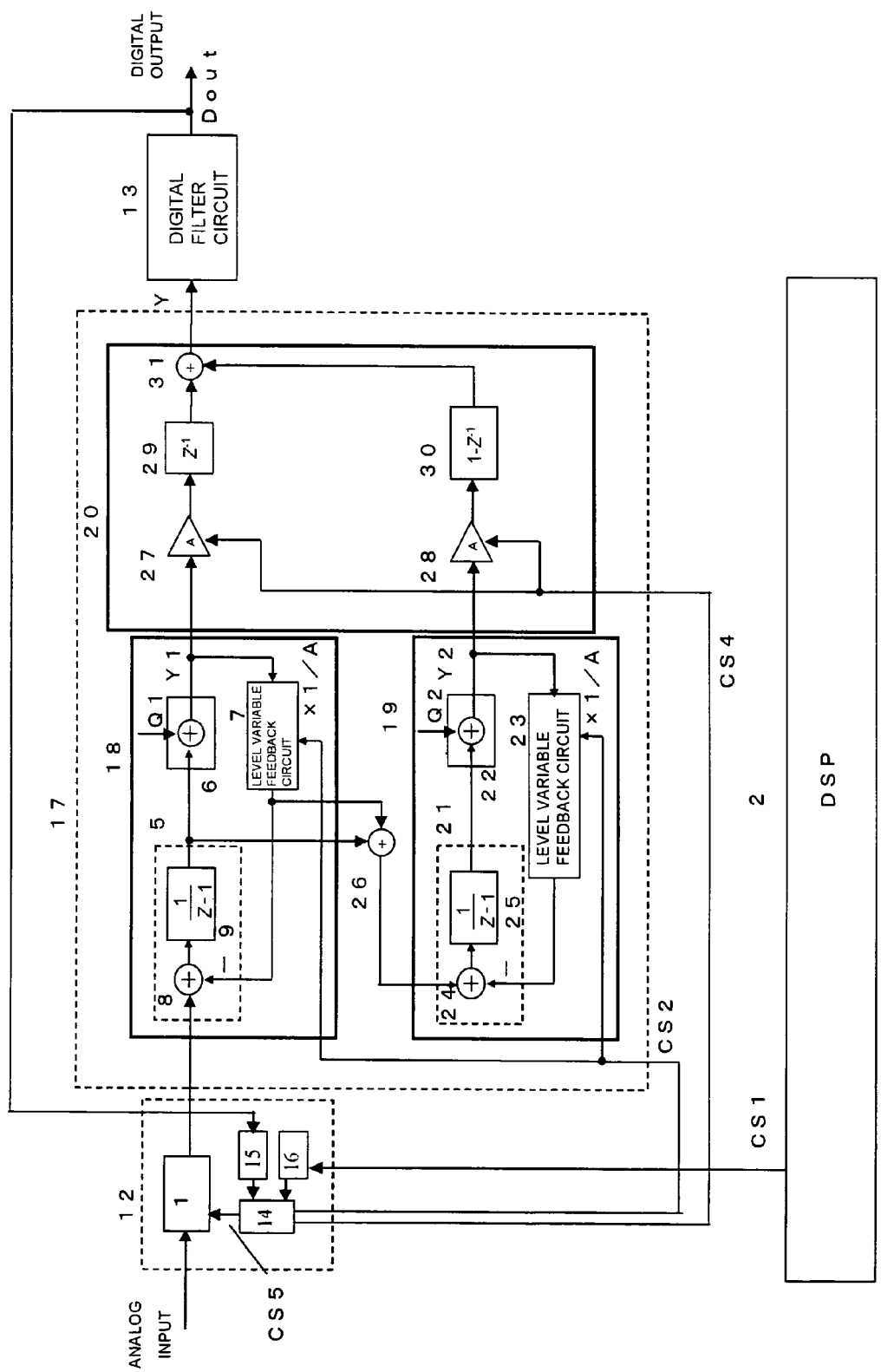
FIG. 11 is a block diagram showing an exemplary configuration which uses, in the third embodiment of the present invention, a different AGC circuit from that in FIG. 1.

The AGC circuit 12 used in the delta-sigma modulation circuit of the present invention may be composed of, as shown in FIG. 11, a variable gain amplifier 1 which inputs an analog signal and whose amplification factor is changed by a control signal CS5; a level detection circuit 15 that detects an amplitude of an output signal from a digital (decimation) filter circuit 13 and outputs a signal level according to the amplitude; a reference level generator 16 that outputs a reference level; and a comparator 14 that compares the signal level outputted from the level detection circuit 15 with a reference level, and outputs a control signal CS5 to the variable gain amplifier 1 according to the comparison result.

INDUSTRIAL APPLICABILITY

A delta-sigma modulation circuit with a gain control function of the present invention has an advantageous effect that the optimum dynamic range can be obtained according to the setting level of a variable gain amplifier without causing the dynamic range to vary depending on the setting level of the variable gain amplifier. The delta-sigma modulation circuit is useful as, for example, a signal processing means such as an A/D conversion circuit and a D/A conversion circuit for digital audio equipment.

What is claimed is:

1. A delta-sigma modulation circuit with a gain control function, the circuit comprising:
    a variable gain amplifier;
    a gain-variable delta-sigma modulator; and
    a control unit that controls the gains of the variable gain amplifier and the delta-sigma modulator, wherein:
    the delta-sigma modulator is composed of a cascaded delta-sigma modulator,
    the cascaded delta-sigma modulator includes:
        a delta-sigma modulation type quantization loop of a first stage having a first integration circuit that inputs an input signal and a first feedback reference level; a first quantizer that quantizes an output from the first integration circuit; and a first converter that generates the first feedback reference level based on an output from the first quantizer;
        at least one delta-sigma modulation type quantization loops of second and subsequent stages, the loop being cascade connected to the delta-sigma modulation type quantization loop of the first stage, and having a second integration circuit that inputs a quantization loop-to-quantization loop signal and a second feedback reference level, the quantization loop-to-quantization loop signal being composed of a signal outputted from a given location in a delta-sigma modulation type quantization loop of a preceding stage; a second quantizer that quantizes an output from the second integration circuit; and a second converter that generates the second feedback reference level based on an output from the second quantizer; and
        a noise removing circuit having a delayer that delays an output from each of the delta-sigma modulation type quantization loops of the first stage and the second and subsequent stages; and a differentiator that differentiates an output from a delta-sigma modulation type quantization loop of a subsequent stage, the noise removing circuit adding the delayed outputs and the differentiated output, and outputting a value of the added outputs, and the control unit gain controls the noise removing circuit as well as the delta-sigma modulator.

2. A delta-sigma modulation circuit with a gain control function, the circuit comprising:
    a variable gain amplifier;
    a gain-variable delta-sigma modulator; and
    a control unit that controls the gains of the variable gain amplifier and the delta-sigma modulator, the control unit comprising:
        a level detection circuit that detects an amplitude of an output signal from the variable gain amplifier and outputs a signal level according to the amplitude;
        a reference level generator that generates a reference level; and
        a comparator that compares the signal level outputted from the level detection circuit with the reference level generated by the reference level generator and then outputs, according to a comparison result, control signals for controlling gains of the variable gain amplifier and the delta-sigma modulator, thereby gain controlling the variable gain amplifier and the delta-sigma modulator.

3. The delta-sigma modulation circuit with a gain control function according to claim 2, wherein
    the reference level generator selectively outputs any one of a plurality of reference levels, and
    the delta-sigma modulation circuit further comprises a digital signal processor that feeds to the reference level generator a control signal by which the any one of the reference levels is selected.

4. A delta-sigma modulation circuit with a gain control function, the circuit comprising:
    a variable gain amplifier;
    a gain-variable delta-sigma modulator;
    a gain-variable filter circuit; and
    a control unit that controls the gains of the variable gain amplifier, delta-sigma modulator and filter circuit, the control unit comprising:
        a level detection circuit that detects an amplitude of an output signal from the variable gain amplifier and outputs a signal level according to the amplitude;
        a reference level generator that generates a reference level; and
        a comparator that compares the signal level outputted from the level detection circuit with the reference level generated by the reference level generator and then outputs, according to a comparison result, control signals for controlling gains of the variable gain amplifier, the delta-sigma modulator, and the filter circuit, thereby gain controlling the variable gain amplifier, the delta-sigma modulator, and the filter circuit.

5. The delta-sigma modulation circuit with a gain control function according to claim 4, wherein
    the reference level generator selectively outputs any one of a plurality of reference levels, and
    the delta-sigma modulation circuit further comprises a digital signal processor that feeds to the reference level generator a control signal by which the any one of the reference levels is selected.

6. The delta-sigma modulation circuit with a gain control function according to claim 1, wherein
    the control unit includes:
        a level detection circuit that detects an amplitude of an output signal from the variable gain amplifier and outputs a signal level according to the amplitude;

a reference level generator that generates a reference level; and a comparator that compares the signal level outputted from the level detection circuit with the reference level generated by the reference level generator and then outputs, according to a comparison result, control signals for controlling gains of the variable gain amplifier, the delta-sigma modulator, and the noise removing circuit, thereby gain controlling the variable gain amplifier, the delta-sigma modulator, and the noise removing circuit.

7. The delta-sigma modulation circuit with a gain control function according to claim 6, wherein the reference level generator selectively outputs any one of a plurality of reference levels, and the delta-sigma modulation circuit further comprises a digital signal processor that feeds to the reference level generator a control signal by which the any one of the reference levels is selected.

8. A delta-sigma modulation circuit with a gain control function, the circuit comprising:

a variable gain amplifier;

a gain-variable delta-sigma modulator; and a control unit that controls the gains of the variable gain amplifier and the delta-sigma modulator, the control unit comprising:

a level detection circuit that detects an amplitude of an output signal from the filter circuit and outputs a signal level according to the amplitude;

a reference level generator that generates a reference level; and a comparator that compares the signal level outputted from the level detection circuit with the reference level generated by the reference level generator and then outputs, according to a comparison result, control signals for controlling gains of the variable gain amplifier and the delta-sigma modulator, thereby gain controlling the variable gain amplifier and the delta-sigma modulator.

9. The delta-sigma modulation circuit with a gain control function according to claim 8, wherein the reference level generator selectively outputs any one of a plurality of reference levels, and the delta-sigma modulation circuit further comprises a digital signal processor that feeds to the reference level generator a control signal by which the any one of the reference levels is selected.

10. A delta-sigma modulation circuit with a gain control function, the circuit comprising:

a variable gain amplifier;

a gain-variable delta-sigma modulator;

a gain-variable filter circuit; and a control unit that controls the gains of the variable gain amplifier, delta-sigma modulator and filter circuit, the control unit comprising:

a level detection circuit that detects an amplitude of an output signal from the filter circuit and outputs a signal level according to the amplitude;

a reference level generator that generates a reference level; and a comparator that compares the signal level outputted from the level detection circuit with the reference level generated by the reference level generator and then outputs, according to a comparison result, control signals for controlling gains of the variable gain amplifier, the delta-sigma modulator, and the filter circuit, thereby gain controlling the variable gain amplifier, the delta-sigma modulator, and the filter circuit.

11. The delta-sigma modulation circuit with a gain control function according to claim 10, wherein the reference level generator selectively outputs any one of a plurality of reference levels, and the delta-sigma modulation circuit further comprises a digital signal processor that feeds to the reference level generator a control signal by which the any one of the reference levels is selected.

12. The delta-sigma modulation circuit with a gain control function according to claim 1, further comprising a filter circuit, wherein the control unit includes:

a level detection circuit that detects an amplitude of an output signal from the filter circuit and outputs a signal level according to the amplitude;

a reference level generator that generates a reference level; and a comparator that compares the signal level outputted from the level detection circuit with the reference level generated by the reference level generator and then outputs, according to a comparison result, control signals for controlling gains of the variable gain amplifier, the delta-sigma modulator, and the noise removing circuit, thereby gain controlling the variable gain amplifier, the delta-sigma modulator, and the noise removing circuit.

13. The delta-sigma modulation circuit with a gain control function according to claim 12, wherein the reference level generator selectively outputs any one of a plurality of reference levels, and the delta-sigma modulation circuit further comprises a digital signal processor that feeds to the reference level generator a control signal by which the any one of the reference levels is selected.

* * * * *